United States Patent [19]

Prall et al.

[11] Patent Number: 5,677,573
[45] Date of Patent: Oct. 14, 1997

[54] FIELD EFFECT TRANSISTOR

[75] Inventors: Kirk Prall; Pai-Hung Pan; Sujit Sharan, all of Boise, Id.

[73] Assignee: Micron Technology, Inc., Boise, Id.

[21] Appl. No.: 743,502

[22] Filed: Nov. 4, 1996

Related U.S. Application Data

[62] Division of Ser. No. 543,705, Oct. 16, 1995, Pat. No. 5,637,518.
[51] Int. Cl.$^6$ ................................................. H01L 29/43
[52] U.S. Cl. ........................... 257/750; 257/754; 257/773
[58] Field of Search ........................... 257/377, 382, 257/750, 756, 773, 775, 754; 437/99

[56] References Cited

U.S. PATENT DOCUMENTS

| | | | |
|---|---|---|---|
| 3,681,668 | 8/1972 | Kobayashi | 257/272 |
| 4,485,552 | 12/1984 | Maedo et al. | 257/555 |
| 4,948,745 | 8/1990 | Pfiester et al. | 437/41 |
| 5,057,899 | 10/1991 | Samata et al. | 257/754 |
| 5,079,180 | 1/1992 | Rodder et al. | 437/44 |
| 5,250,454 | 10/1993 | Maszara | 437/41 |
| 5,321,306 | 6/1994 | Choi et al. | 257/754 |
| 5,378,651 | 1/1995 | Agnello et al. | 437/106 |

FOREIGN PATENT DOCUMENTS 59-189677A 10/1984 Japan ........................... 437/99

OTHER PUBLICATIONS

T.Y. Hsieh et al., "Silicon Homoepitaxy by Rapid Thermal Processing Chemical Vapor Deposition (RTPCVD)—A Review", J. Electrochem. Soc., vol. 138, No. 4, Apr. 1991, pp. 1188–1207.

Rahat, Ido et al., "Reducing the Temperature of Conventional Silicon Epitaxy for Selective Poly-Epi Growth", J. Electrochem. Soc., vol. 138, No. 8, Aug. 1991, pp. 2370–2374.

Mazure, Carlos et al., "Facet Engineered Elevated Source/Drain By Selective Si Epitaxy For 0.35 Micron MOSFETS", IEDM, 1992, pp. 853–856.

Primary Examiner—Tom Thomas
Assistant Examiner—David B. Hardy
Attorney, Agent, or Firm—Wells, St. John, Roberts, Gregory & Matkin, P.S.

[57] ABSTRACT

A method of forming a field effect transistor relative to a monocrystalline silicon substrate, where the transistor has an elevated source and an elevated drain, includes: a) providing a transistor gate over the monocrystalline silicon substrate, the gate being encapsulated in electrically insulative material; b) providing outer exposed monocrystalline silicon substrate surfaces adjacent the transistor gate; c) cleaning the outer exposed substrate surfaces to remove oxide and impurities therefrom; d) within a rapid thermal chemical vapor deposition reactor and after the cleaning step, chemical vapor depositing a conductively doped non-polycrystalline silicon layer over the cleaned substrate surfaces adjacent the transistor gate, the non-polycrystalline silicon layer having an outer surface, the substrate not being exposed to oxidizing or contaminating conditions between the time of cleaning and the chemical vapor depositing; and e) after chemical vapor depositing, exposing the doped non-polycrystalline silicon layer to high temperature annealing conditions effective to, i) produce doped monocrystalline silicon extending outwardly from the substrate surface, and ii) produce doped polycrystalline silicon extending inwardly from the outer surface; the doped monocrystalline silicon and doped polycrystalline silicon joining at an interface which is displaced elevationally outward of the substrate surfaces. A field effect transistor is also claimed.

1 Claim, 3 Drawing Sheets

FIELD EFFECT TRANSISTOR

RELATED PATENT DATA

The present application is a divisional application of application Ser. No. 08/543,705 which was filed on Oct. 16, 1995, now U.S. Pat. No. 5,637,518.

TECHNICAL FIELD

This invention relates to field effect transistors, and to methods of making field effect transistors having an elevated source and an elevated drain.

BACKGROUND OF THE INVENTION

Field effect transistors are comprised of a pair of diffusion regions, referred to as a source and a drain, spaced apart within a semiconductive substrate. Such include a gate provided adjacent the separation region and between the diffusion regions for imparting an electric field to enable current to flow between the diffusion regions. The substrate material adjacent the gate and between the diffusion regions is referred to as the channel. The semiconductive substrate typically comprises a bulk monocrystalline silicon substrate having a light conductivity dopant impurity concentration. Alternately, the substrate can be provided in the form of a thin layer of lightly doped semiconductive material over an underlying insulating layer. Such are commonly referred to as semiconductor-on-insulator (SOI) constructions.

Integrated circuitry fabrication technology continues to strive to increase circuit density, and thereby minimize the size and channel lengths of field effect transistors. Improvements in technology have resulted in reduction of field effect transistor size from long-channel devices (i.e., channel lengths typically greater than 2 microns) to short-channel devices (i.e., channel lengths typically less than 2 microns).

As field effect transistor channel lengths (i.e., gate widths) became smaller than about 3 microns, so-called short channel effects began to become increasingly significant. As a result, device design and consequently process technology had to be modified to take these effects into account so that optimum device performance could continue to be obtained. For example, as device dimensions are reduced and the supply voltage remains constant, the lateral electric field generated within the substrate increases. If the field becomes strong enough, it can give rise to so-called hot-carrier effects. This becomes a significant problem with channel lengths smaller than 1.5 microns. Hot-carrier effects cause unacceptable performance degradation in n-type transistor devices built with conventional drain structures if their channel lengths are less than 2 microns.

A preferred method of overcoming this problem is to provide lightly doped drain (LDD) regions within the substrate relative to the channel region in advance of the source and drain regions. The LDD regions are provided to be lighter conductively doped (i.e., less concentration) than the source and drain regions. This facilitates sharing of the voltage drop by the drain in the channel, as opposed to the stark voltage drop at the channel occurring in non-LDD n-type transistors. The LDD regions absorb some of the voltage drop potential into the drain, thus reducing hot carrier effects. As a result, the stability of the device is increased.

However, further shrinking of the gate width (i.e., shorter channel length) makes the LDD region of a conventional transistor less effective. For example, shorter channel lengths require the LDD length to be reduced to ensure sufficient semiconductive material between the diffusion regions to prevent conductance when the gate voltage is off. One way of attending to such problems is to displace the predominant portion of the source and drain regions outwardly away from the substrate by elevating them. For example, a thin (e.g., 200 nm) epitaxial layer of monocrystalline silicon can be selectively grown from exposed monocrystalline source and drain substrate areas within an epi reactor, and provided with sufficiently high conductivity doping to effectively provide source and drain regions. The lighter doped LDD regions can be provided within the substrate immediately below the elevated source and drain. Thus, a channel of sufficient length is effectively provided despite the smaller width gate. The resulting transistor has significantly reduced short channel effects.

Epitaxial monocrystalline silicon in the prior art is provided by chemical vapor deposition in a reactor specifically designed for epitaxial silicon deposition, in a slow, costly and complicated process. It would be desirable to develop improved and alternate methods of providing monocrystalline silicon without using such specifically dedicated reactors.

SUMMARY OF THE INVENTION

The invention encompasses composite regions which include polycrystalline silicon and monocrystalline silicon. In one aspect, the invention encompasses a region proximate a semiconductor substrate which comprises a composite of inner conductively doped monocrystalline silicon and outer conductively doped polysilicon. The inner monocrystalline silicon has a low to high concentration gradient of conductivity enhancing impurity from adjacent the semiconductor substrate to outwardly therefrom.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
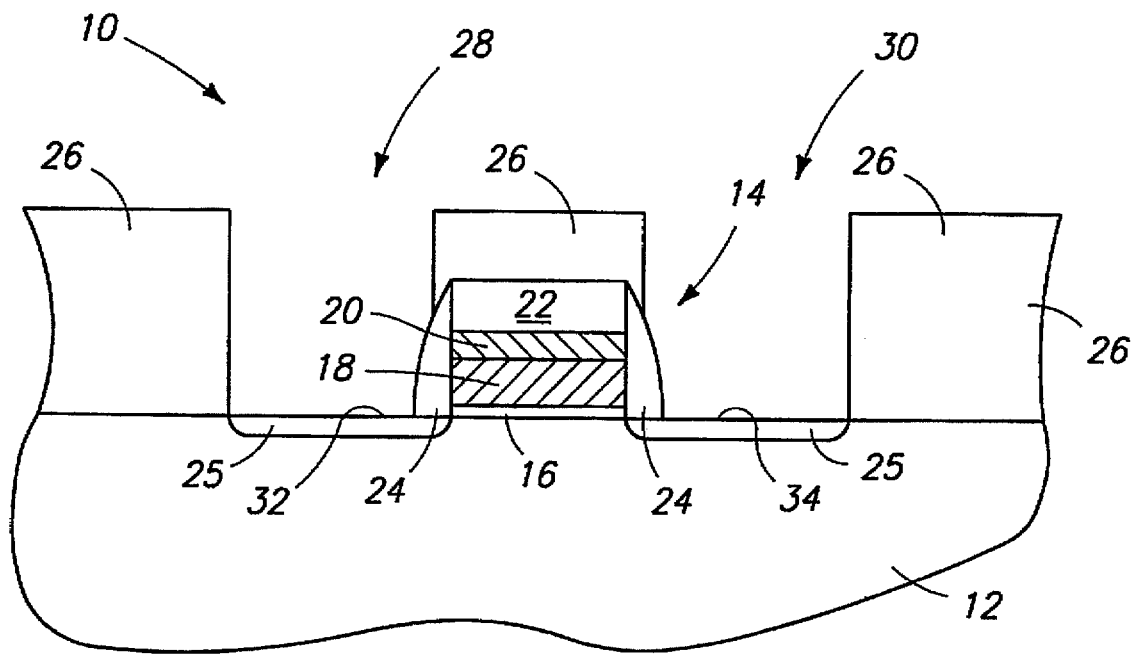
FIG. 1 is a diagrammatic sectional view of a semiconductor wafer fragment at one processing step in accordance with the invention.
Figure 2:
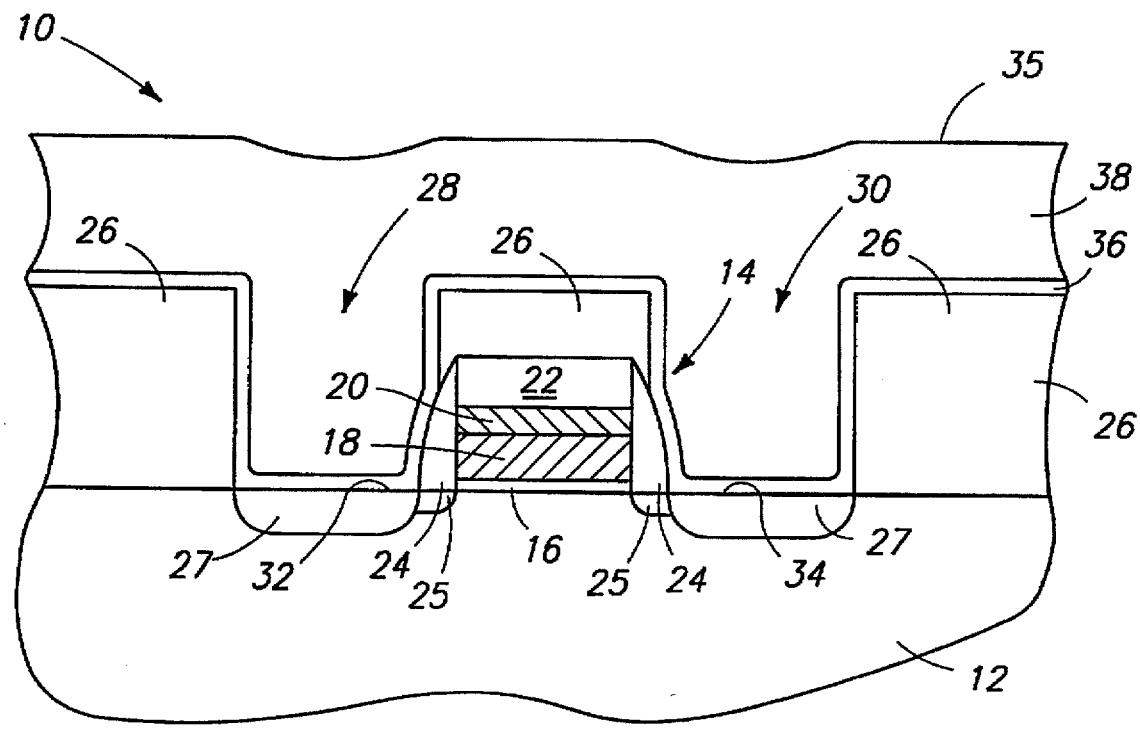
FIG. 2 is a view of the FIG. 1 wafer fragment at a processing step subsequent to that shown by FIG. 1.

This disclosure of the invention is submitted in furtherance of the constitutional purposes of the U.S. Patent Laws "to promote the progress of science and useful arts" (Article 1, Section 8).

In accordance with one aspect of the invention, a method of forming a field effect transistor relative to a monocrystalline silicon substrate, where the transistor has an elevated source and an elevated drain, comprises the following steps:

providing a transistor gate over the monocrystalline silicon substrate, the gate being encapsulated in electrically insulative material;

providing outer exposed monocrystalline silicon substrate surfaces adjacent the transistor gate;

cleaning the outer exposed substrate surfaces to remove oxide and impurities therefrom;

within a rapid thermal chemical vapor deposition reactor and after the cleaning step, chemical vapor depositing a conductively doped non-polycrystalline silicon layer over the cleaned substrate surfaces adjacent the transistor gate, the non-polycrystalline silicon layer having an outer surface, the substrate not being exposed to oxidizing or contaminating conditions between the time of cleaning and the chemical vapor depositing; and after chemical vapor depositing, exposing the doped non-polycrystalline silicon layer to high temperature annealing conditions effective to, a) produce doped monocrystalline silicon extending outwardly from the substrate surface, and b) produce doped polycrystalline silicon extending inwardly from the outer surface; the doped monocrystalline silicon and doped polycrystalline silicon joining at an interface which is displaced elevationally outward of the substrate surfaces.

In accordance with another aspect of the invention, a field effect transistor comprises:

a monocrystalline silicon semiconductor substrate having spaced conductively doped diffusions regions provided therein;

a transistor gate positioned operatively adjacent the substrate between the diffusion regions;

an electrically insulating layer over the substrate and gate; and a pair of electrically conductive plugs extending outwardly of the monocrystalline silicon substrate from the diffusion regions through the insulating layer, the electrically conductive plugs comprising a composite of inner conductively doped monocrystalline silicon and outer conductively doped polysilicon, the doped monocrystalline silicon and doped polycrystalline silicon joining at an interface which is displaced elevationally outward of the substrate within the electrically insulating layer.

In accordance with still a further aspect of the invention, a method of forming a field effect transistor relative to a monocrystalline silicon substrate, where the transistor has an elevated source and an elevated drain, comprises the following steps:

providing a transistor gate over the monocrystalline silicon substrate, the gate being encapsulated in electrically insulative material;

providing outer exposed monocrystalline silicon substrate surfaces adjacent the transistor gate;

cleaning the outer exposed substrate surfaces to remove oxide and impurities therefrom; and within a rapid thermal chemical vapor deposition reactor and after the cleaning step, chemical vapor depositing a monocrystalline doped silicon layer over the cleaned substrate surfaces adjacent the transistor gate, the substrate not being exposed to oxidizing or contaminating conditions between the time of cleaning and the chemical vapor depositing, the step of chemical vapor depositing comprises varying a rate of conductivity enhancing dopant fed to the reactor during deposition from a lower rate to a higher rate to ultimately provide a low to high concentration gradient within the monocrystalline silicon from adjacent the substrate to outwardly therefrom. More particularly, FIG. 1 illustrates a semiconductor wafer fragment in process indicated generally with reference numeral 10. Such is comprised of a bulk monocrystalline silicon substrate 12 and a transistor gate 14 provided outwardly thereof. Gate construction 14 is comprised of a gate oxide layer 16, an overlying conductively n-type doped polysilicon region 18, an overlying higher conductivity silicide region 20, an insulating cap 22, and insulating sidewall spacers 24. Thus, gate construction 14 has its conductive portions essentially encapsulated in electrically insulative material. An LDD implant has been provided to produce LDD regions 25.

An insulating dielectric layer 26, preferably borophosphosilicate glass (BPSG), is provided outwardly of substrate 12 and gate construction 14. Such is patterned as shown to provide the illustrated pair of contact openings 28, 30 therethrough to substrate 12. Thusly, outer exposed monocrystalline silicon substrate surfaces 32 and 34 are provided adjacent transistor gate 14.

Wafer 10 is subjected to cleaning conditions to effectively clean outer exposed substrate surfaces 32 and 34 to remove oxide and other impurities therefrom. One example cleaning technique would utilize $H_2$ gas at 800° C. in a chemical vapor deposition reactor. Alternately, $NF_3$ can be utilized at 100° C. Numerous other cleaning techniques could also be utilized to effectively clean surfaces 32 and 34.

Immediately thereafter, and within a rapid thermal chemical vapor deposition reactor, conductively doped non-polycrystalline silicon layers 36 and 38 are chemical vapor deposited over cleaned substrate surfaces 32 and 34 adjacent transistor gate 14. For purposed of the continuing discussion, layer 38 has an outer surface 35. One preferred technique for conducting such processing is to utilize a single rapid thermal chemical vapor deposition reactor for both the deposition and cleaning steps, with the substrate not being removed from the reactor between steps. Alternately, such processing can be conducted in separate chambers of a cluster tool apparatus without breaking vacuum, such as an Applied Materials Centura System. Such equipment enables processing and transfer of wafers between chambers without exposure to oxidizing or other contaminating conditions. Example reactor conditions and chemistry for providing non-polycrystalline silicon includes, a) 590° C., 80 Torr, 0.5 slm $SiH_4$ and 10 slm $H_2$; and b) 550° C., 80 Torr, 0.5 slm $Si_2H_6$ and 10 slm $H_2$.

The material of composite non-polycrystalline silicon layers 36 and 38 preferably predominantly comprises, or consists essentially of, amorphous silicon. Preferably, layer 36 is provided to be lighter doped with conductivity enhancing impurity than layer 38 to effectively provide a low to high concentration gradient of conductivity enhancing material within the silicon within contact openings 28 and 30 from adjacent substrate 12 to outwardly therefrom. Moving of the n+/n– interface higher up into the source/drain minimizes short channel effects. Two composite layers 36 and 38 are shown in the drawings for clarity. However, a more preferred method for providing such concentration gradient would be to use one continuous deposition process wherein a rate of conductivity enhancing dopant fed to the reactor during deposition is varied from a lower rate to a later higher rate to provide the desired increasing gradient. Substrate 12 can be doped to define source and drain diffusion regions 27. Such can be provided by a separate implant, or by out-diffusion of conductivity dopant from composite non-polycrystalline silicon layers 36 and 38. Alternately, diffusion regions 27 and 25 might be eliminated in the formation of a transistor having an elevated source and an elevated drain.

Figure 3:
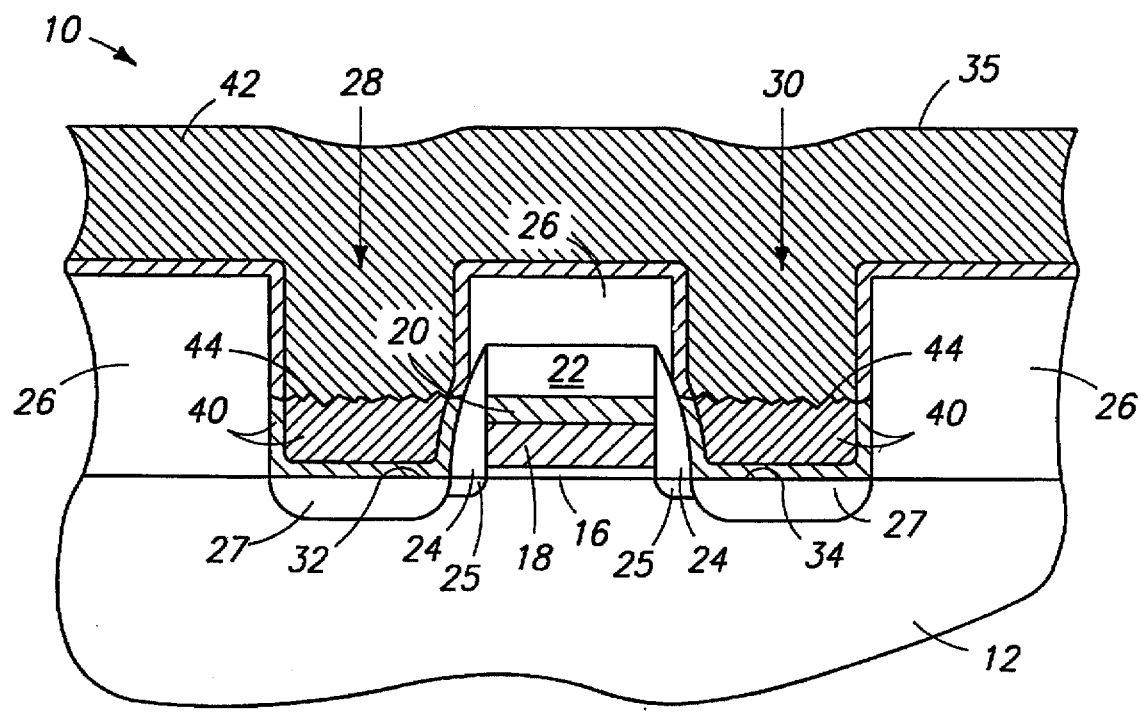
FIG. 3 is a view of the FIG. 1 wafer fragment at a processing step subsequent to that shown by FIG. 2.

Referring to FIG. 3, the wafer with doped non-polycrystalline silicon layers 36/38 is exposed to high temperature annealing conditions effective to, a) produce a doped monocrystalline silicon region 40 extending outwardly from substrate surfaces 32 and 34, and b) produce doped polysilicon region 42 extending inwardly from outer surface 35. Regions 40 and 42 join at an interface 44 which is displaced elevationally outward of substrate surfaces 32 and 34 and within the confines of the thickness of insulating dielectric layer 26. Example and preferred annealing conditions include exposing the wafer to a temperature of from 550° C. to 750° C., with 650° C. being preferred, within an inert atmosphere, such as $N_2$. Processing time for high temperature anneal is expected to be accomplished in two hours or less. Such high temperature processing effectively will transform amorphous silicon into a crystalline form, with such crystalline form starting as monocrystalline silicon from substrate 12 and as polysilicon from outer surface 35. Ideally, further processing of the substrate will include minimal thermal processing to prevent the dopants in the layer 36/38 from diffusing.

Alternately, the high temperature annealing step is conducted within the same rapid thermal chemical vapor deposition reactor as the chemical vapor depositing and cleaning steps, with the substrate not being removed from the reactor during the plurality of the cleaning, depositing and annealing steps. Alternately, a cluster tool utilizing different isolated chambers could be utilized. Higher annealing temperatures, such as from 700° C. to 900° C., can be utilized to minimize the anneal time.

Figure 4:
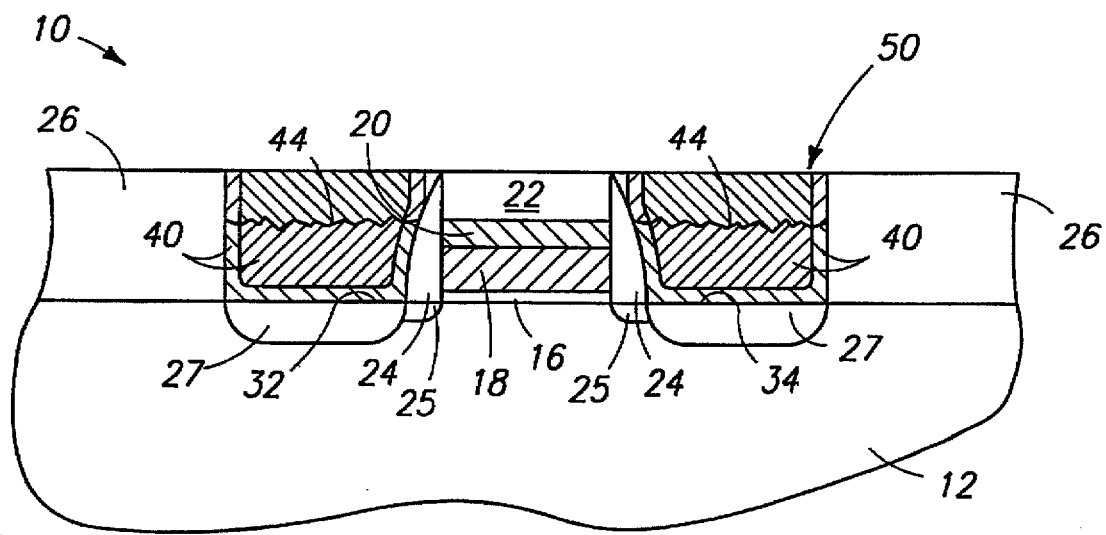
FIG. 4 is a view of the FIG. 1 wafer fragment at a processing step subsequent to that shown by FIG. 3.

Referring to FIG. 4, annealed composite layer 36/38 and dielectric layer 26 are subjected to chemical mechanical polishing to provide the illustrated upper planar surface 50. The invention also contemplates a field effect transistor produced according to the disclosed processes, as well as to field effect transistors produced by other processes.

Figure 5:
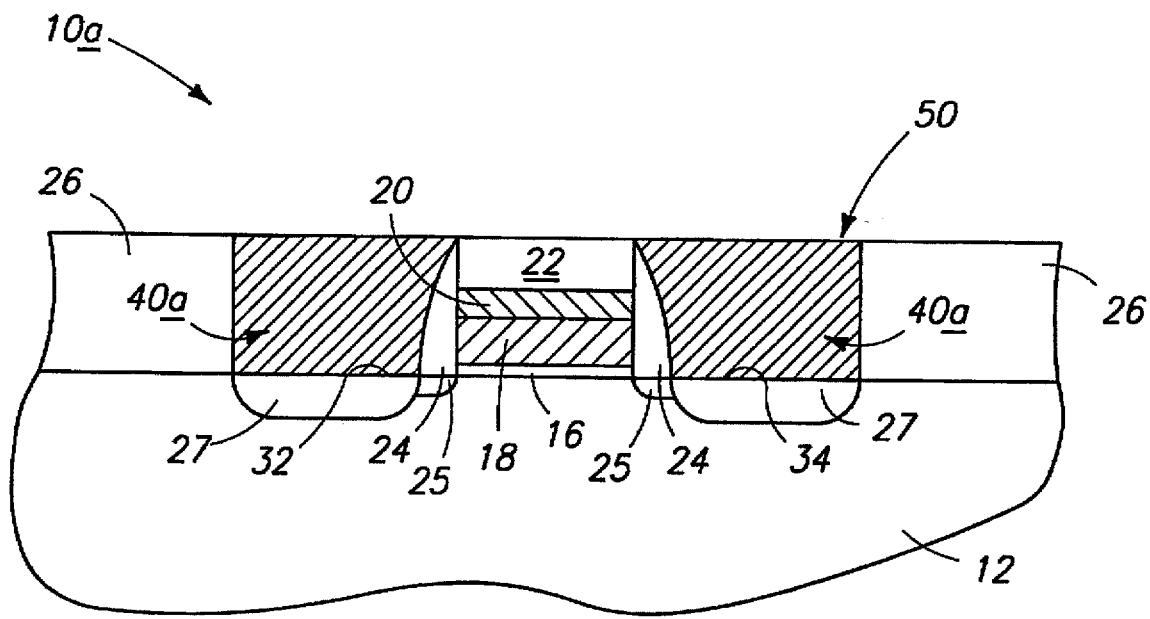
FIG. 5 is a diagrammatic sectional view of an alternate embodiment semiconductor wafer fragment in accordance with the invention.

FIG. 5 illustrates an alternate embodiment semiconductor wafer fragment 10a. Like numerals from the first described embodiment are utilized where appropriate, with differences being indicated by the suffix "a" or with different numerals. The wafer fragment 10a differs from the first described embodiment in the provision of plugging material within the contact openings which substantially entirely comprises conductively doped monocrystalline silicon as-deposited. The above described cleaning and subsequent in situ non-polycrystalline silicon deposition may facilitate direct deposition of monocrystalline silicon within the contact openings, such that a subsequent high temperature annealing step is not necessary. Example conditions for providing such monocrystalline silicon layer as-deposited is expected to include, a) 650° C., 80 Torr, 0.5 slm $SiH_4$ and 10 slm $H_2$; and b) 560° C., 80 Torr, 0.5 slm $Si_2H_6$ and 10 slm $H_2$. Again, the substrate would not be exposed to oxidizing or contaminating conditions between the time of surface cleaning and the chemical vapor depositing. Example clean processes include an $H_2$ bake for 2 minutes at 800° C. to 900° C., or using an inert or a reactive plasma such as $NF_3$.

Thus, processes have been described which enable utilization of rapid thermal chemical vapor depositions for providing epitaxial monocrystalline silicon elevated sources and drains in a manner which has heretofore not been possible.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A field effect transistor comprising:

a monocrystalline silicon semiconductor substrate having spaced conductively doped diffusions regions provided therein;

a transistor gate positioned operatively adjacent the substrate between the diffusion regions;

an electrically insulating layer over the substrate and gate; and a pair of electrically conductive plugs extending outwardly of the monocrystalline silicon substrate from the diffusion regions through the insulating layer, the electrically conductive plugs comprising a composite of inner conductively doped monocrystalline silicon and outer conductively doped polysilicon, the doped monocrystalline silicon and doped polycrystalline silicon joining at an interface which is displaced elevationally outward of the substrate within the electrically insulating layer;

wherein the inner monocrystalline silicon has a low to high concentration gradient of conductivity enhancing impurity from adjacent the substrate to outwardly therefrom.

* * * * *